US006380789B1

(12) United States Patent
Baschirotto et al.

(10) Patent No.: US 6,380,789 B1
(45) Date of Patent: Apr. 30, 2002

(54) SWITCHED INPUT CIRCUIT STRUCTURE

(75) Inventors: Andrea Baschirotto, Tortona; Guido Brasca, Varese; Rinaldo Castello, Arcore; Giampiero Montagna, Tortona, all of (IT)

(73) Assignee: SGS-Thomson Microelectronics S.r.l., Agrate Brianza (IT)

( * ) Notice: Subject to any disclaimer, the term of this patent is extended or adjusted under 35 U.S.C. 154(b) by 0 days.

(21) Appl. No.: 09/060,617

(22) Filed: Apr. 15, 1998

(51) Int. Cl.[7] .................................................. G06G 7/18
(52) U.S. Cl. ......................................... 327/336; 327/344
(58) Field of Search .................................... 327/336, 337, 327/344, 345, 554; 330/9, 253, 258

(56) References Cited

U.S. PATENT DOCUMENTS 5,949,666 A * 9/1999 Daniele et al. ............. 327/336
5,973,537 A * 10/1999 Baschirotto et al. ........ 327/337
6,084,465 A * 7/2000 Dasgupta ................... 327/554

* cited by examiner

Primary Examiner—Timothy P. Callahan
Assistant Examiner—Linh Nguyen
(74) Attorney, Agent, or Firm—Jenkens & Gilchrist, P.C.

(57) ABSTRACT

A switched input circuit structure of the type which includes an input terminal receiving an input voltage and an output terminal connected to an input capacitor. An operational amplifier is included having a non-inverting terminal connected to a ground reference terminal, an inverting input terminal, and an output terminal feedback connected to the inverting input terminal and held in a virtual ground condition by a parallel of first and second charge paths which are connected between the input terminal of the switched input circuit structure and the inverting input terminal of the operational amplifier and connected to the supply voltage reference and the ground reference, respectively.

16 Claims, 1 Drawing Sheet

SWITCHED INPUT CIRCUIT STRUCTURE

FIELD OF THE INVENTION

This invention relates to a switched input circuit structure for operation at low supply voltage levels. Specifically, the invention relates to a switched input circuit structure of the type having an input terminal on which an input voltage is received and an output terminal connected to an input capacitor.

1. Background of the Invention

The invention concerns in particular, but not exclusively, a switched input circuit structure of the serial type in SC configurations, and reference will be made in the ensuing description to this field of application for convenience of illustration.

2. Background Art

As is well known, when operating at low supply voltage levels, e.g., below 1.2V, it becomes difficult to ensure that switches incorporated to circuits of the SC type are fully closed. Especially critical in this respect are serial switches, that is, switches which are connected in series with the flow of the main signal in the circuit which contains them. These serial switches are required to be in the "on" state at each value of the main signal swing.

This problem has been solved for circuits which include operational amplifiers by means of arrangements known as switched-opamps. The critical switches placed at the output of each operational amplifier are replaced by a step of turning on/off the operational amplifier. This solution obviously cannot be applied to input signals, whose source is normally taken to be a very low impedance one.

FIG. 1 shows schematically an input circuit structure 1 of an SC circuit including, in particular, an input terminal I1 and a series of an input switch S1 and an input capacitor Cin. This input circuit structure 1 further includes a controlled power-on switch S2 connected between a central connection node X, intervening between the input switch S1 and the input capacitor Cin, and a voltage reference for instance the supply VDD.

While the power-on switch S2 can be optimized by suitably selecting the value of its reference voltage V2, the input switch S1 cannot be closed when the input voltage Vin received by the input terminal I1 approaches a value halfway toward the supply voltage VDD, namely a value VDD/2, as shown schematically in FIG. 2.

More particularly, FIG. 2 is a plot of the typical conductance gds for an input switch as the input voltage Vin applied thereto varies. A comparison of the graphs shown in FIG. 2 brings out the critical aspects of the input switch operation at low values of the supply voltage VDD, e.g., of 1.2V.

In particular, it is possible to appreciate that for supply voltage values Vdd of at least 5 V, the transconductance value gds assumes a value higher than zero around Vdd/2 while it assumes the zero value for a supply voltage value Vdd=1.2 V. No other types of input switches are currently known which can operate in a condition of low supply voltage.

The underlying technical problem of this invention is to provide a serial switch for circuits of the SC type, which has such structural and functional features that it can operate correctly even at low values of the supply voltage.

SUMMARY OF THE INVENTION

Accordingly, the present invention provides a switched input circuit structure of the type which includes an input terminal receiving an input voltage, and an output terminal connected to an input capacitor. The structure comprises an operational amplifier having a non-inverting terminal connected to a ground reference terminal, an inverting input terminal, and an output terminal feedback connected to the inverting input terminal and held in a virtual ground condition by a parallel of first and second charge paths which are connected between the input terminal of the switched input circuit structure and the inverting input terminal of the operational amplifier and connected to the supply voltage reference and the ground reference, respectively.

Additional objects, advantages, novel features of the present invention will become apparent to those skilled in the art from this disclosure, including the following detailed description, as well as by practice of the invention. While the invention is described below with reference to preferred embodiment(s), it should be understood that the invention is not limited thereto. Those of ordinary skill in the art having access to the teachings herein will recognize additional implementations, modifications, and embodiments, as well as other fields of use, which are within the scope of the invention as disclosed and claimed herein and with respect to which the invention could be of significant utility.

BRIEF DESCRIPTION OF THE DRAWINGS

The features and advantages of the switched input circuit structure according to the invention will be apparent from the following description of an embodiment thereof, given as a non-limiting example with reference to the accompanying drawings.

In the drawings.

DETAILED DESCRIPTION OF A PREFERRED EMBODIMENT OF THE INVENTION

Generally, the present invention provides an input circuit structure comprising an operational amplifier which is suitably feedback-connected to operate as a switch and having a first input connected to the circuit ground and a second input held to a virtual ground by appropriate capacitors.

Figure 3:
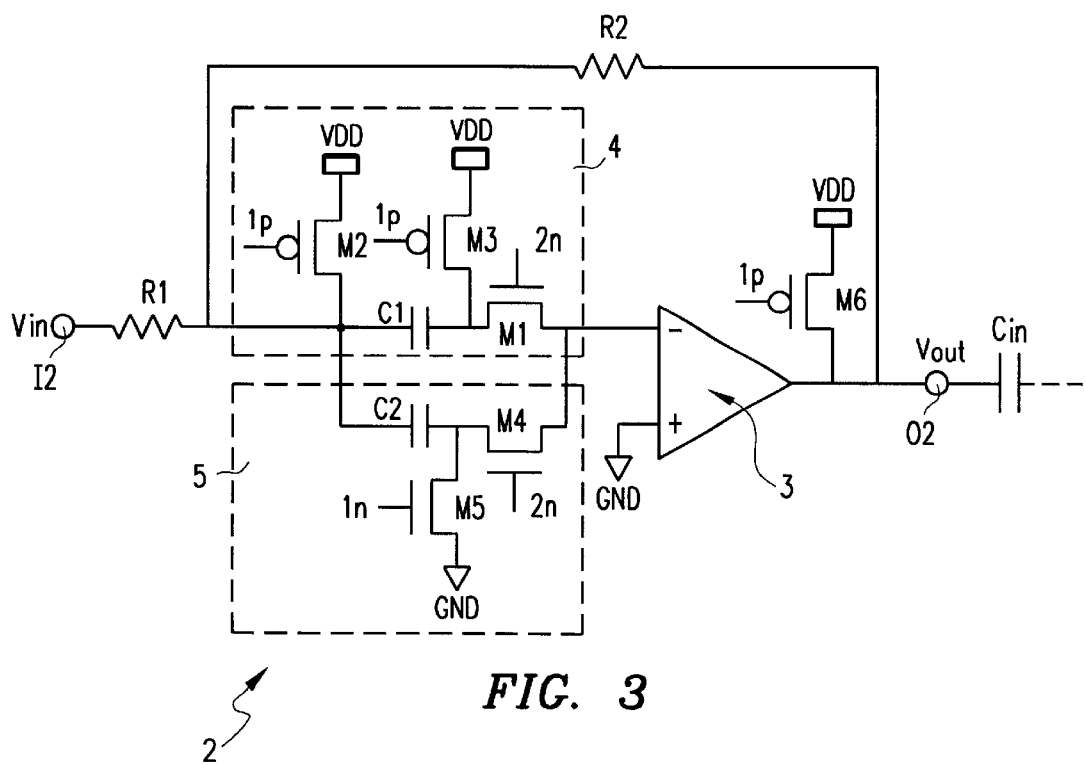
FIG. 3 shows schematically an input circuit structure according to the invention.

Referring now to the drawing views, in particular to FIG. 3, generally and schematically shown at 2 is a switched input circuit structure according to the invention. The switched input circuit structure 2 has an input terminal I2, receiving an input voltage Vin, and an output terminal 02, substantially corresponding to the circuit node X of the input circuit structure 1 shown schematically in FIG. 1 and being connected to an input capacitor Cin.

Advantageously in this invention, the switched input circuit structure 2 comprises an operational amplifier 3 which has a non-inverting (+) terminal connected to a ground reference terminal GND, an inverting (−) input terminal, and an output terminal feedback connected to the inverting input terminal (−). The switched input circuit structure 2 further comprises a first resistive element R1 connected between the input terminal I2 of the switched input circuit structure 2 and the inverting (−) input terminal of the operational amplifier 3, and a second resistive element R2 connected in the feedback path between the output terminal and the inverting (−) input terminal of the switched input circuit structure 2.

The inverting (−) input terminal of the operational amplifier 3 is held in a virtual ground condition by a parallel of first 4 and second 5 charge paths. These charge paths 4 and 5 are connected in parallel between the input terminal I2 of the switched input circuit structure 2 and the inverting (−) input terminal of the operational amplifier 3, and are connected to the supply voltage reference VDD and the ground GND, respectively. In particular, the first charge path 4 includes a series of a first capacitor C1 and a first MOS transistor M1. The first capacitor C1 has a first terminal connected to the input terminal I2 of the switched input circuit structure 2 through the first resistive element R1, and to the supply voltage reference VDD through a second MOS transistor M2, and has a second terminal connected to the supply voltage reference VDD through a third MOS transistor M3.

Likewise, the second charge path 5 includes a series of a second capacitor C2 and a fourth MOS transistor M4. The second capacitor C2 has a first terminal connected to the is input terminal I2 of the switched input circuit structure 2 through the first resistive element R1, and to the supply voltage reference VDD through the second MOS transistor M2, and has a second terminal connected to the ground GND through a fifth MOS transistor M5.

Lastly, the switched input circuit structure 2 comprises a sixth, decoupling MOS 20 transistor M6 connected between the output terminal of the operational amplifier 3 and the supply voltage reference VDD. The switched input circuit structure 2 according to the present invention operates as a two-phase clock, which is a typical switching capacitor structure.

Hereinafter reference will be made to a phase A of the circuit structure 2, which will correspond to a "precharge" operation for the capacitors C1, C2; and to a second phase B which corresponds to a shut off operation for the capacitors C1, C2 in order to activate a signal flow toward the operational amplifier 3. The phases A and B are dynamically activated one after the other.

FIG. 3 reports the signals applied to the control terminals of the transistors incorporated into the switched input circuit structure 2 during the A and B phases. Keeping in mind that a PMOS transistor is on when its gate terminal is biased by a ground GND voltage reference and an NMOS transistor is on when its gate terminal is biased by a positive Vdd voltage reference, the following logos have been adopted:

1p indicates the on status of the PMOS transistor during the A phase, and therefore the application of a ground potential to the gate of such a transistor;

1n indicates the on status of the NMOS transistor during the A phase, and therefore the application of a Vdd potential to the gate of such a transistor;

2p indicates the off status of the PMOS transistor during the B phase, and therefore the application of a Vdd potential to the gate of such a transistor;

2n indicates the on status of the NMOS transistor during the B phase, and therefore the application of a Vdd potential to the gate of such a transistor;

The above activation signals 1p/2p and 1n/2n may be easily generated by a known phase generator.

According to the reference signs used in FIG. 3, during the A phase the signal 1p drives the transistors M2 and M3 charge the capacitor C1; while the transistor M5 charges the capacitor C2. During the second B phase, the transistors M1 and M4 are on and a signal flow is allowed toward the operational amplifier 3.

Figure 1:
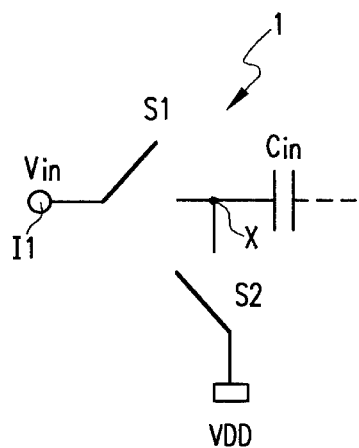
FIG. 1 shows a basic scheme for an input circuit structure which comprises at least one input switch and one power-on switch, according to the prior art.
Figure 2:
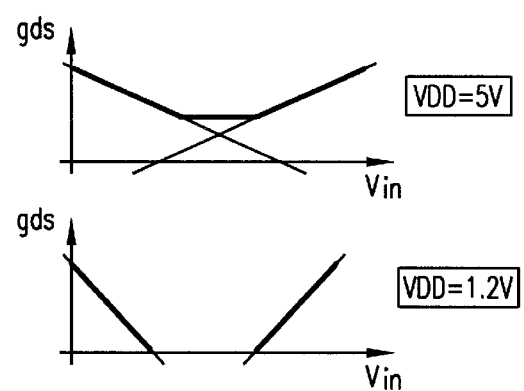
FIG. 2 is a schematic plot of the typical conductance of an input switch vs. variation of an input voltage applied thereto.

Referring now to FIG. 1, the A phase corresponds to the switch S2 being in a turned on stated, leading to the precharge of the capacitor Cin, while the B phase corresponds to the switch S1 being in a turned on state, leading to the current flow through the structure 1. The operation of the switched input circuit structure 2 according to this invention will now be described. During this A phase, the output terminal 02 goes to the same value as the supply voltage VDD, in a similar way as the prior art input circuit structure 1.

With this step, the first capacitor C1 is charged to the same value as the supply voltage VDD, whereas the second capacitor C2 is fully discharged. In this situation, no current will be flowing through the second resistive element R2, since both ends of the latter are charged to the value of the supply voltage VDD.

During a second B phase, the first C1 and second C2 capacitors are connected, in parallel with each other, to the virtual ground of the operational amplifier 3 whose output goes to ground potential GND upon the feedback loop being closed. Retention of the charge at the virtual ground node causes the other terminals of the capacitors C1 and C2 to go to the value VDD/2. Advantageously in this invention, this value cannot be varied by any charge passages.

At this point, the input signal Vin (having a mean value equal to VDD/2) is allowed to pass to the output of the operational amplifier 3 through the first R1 and second R2 resistive elements, like in an ordinary inverting stage.

Advantageously in this invention, the prior art switches S1 and S2 are implemented by transistors of the MOS type; in particular, by N-channel MOS (NMOS) transistors, if connected to the ground GND, and by P-channel MOS (PMOS) transistors, if connected to the supply voltage reference VDD.

Although an embodiment of the present invention has been shown and described in detail herein, along with certain variants thereof, many other varied embodiments that incorporate the teachings of the invention may be easily constructed by those skilled in the art. Accordingly, the present invention is not intended to be limited to the specific form set forth herein, but on the contrary, it is intended to cover such alternatives, modifications, and equivalents, as can be reasonably included within the spirit and scope of the invention.

We claim:

1. A switched input circuit structure of the type which includes an input terminal receiving an input voltage, and an output terminal connected to an input capacitor, comprising:

an operational amplifier having a non-inverting terminal connected to a ground reference terminal, an inverting input terminal, and an output terminal feedback connected to the inverting input terminal held in a virtual ground condition; and a parallel of first and second charge paths which are connected between the input terminal of the switched input circuit structure and the inverting input terminal of the operational amplifier, and connected to the supply voltage reference and the ground reference, respectively, said first charge path including a first capacitor having plates that are each selectively connected to a supply voltage reference.

2. The switched input circuit structure according to claim 1, wherein said first charge path includes a series connection of the first capacitor and a first transistor, said first charge path being operative to charge and discharge said first capacitor.

3. The switched input circuit structure according to claim 2, wherein said first capacitor has a first terminal connected to the input terminal of the switched input circuit structure and connected to the supply voltage reference through a second transistor, and has a second terminal connected to the supply voltage reference through a third transistor.

4. The switched input circuit structure according to claim 3, wherein said second and third transistors are P-channel MOS transistors.

5. The switched input circuit structure according to claim 1, wherein said second charge path includes a series connection of a second capacitor and a fourth transistor, said second charge path being operative to charge and discharge said second capacitor.

6. A switched input circuit structure of the type which includes an input terminal receiving an input voltage, and an output terminal connected to an input capacitor, comprising:

an operational amplifier having a non-inverting terminal connected to a ground reference terminal, an inverting input terminal, and an output terminal feedback connected to the inverting input terminal held in a virtual ground condition; and a parallel combination of first and second charge paths which are connected between the input terminal of the switched input circuit structure and the inverting input terminal of the operational amplifier, and connected to the supply voltage reference and the ground reference, respectively, said second charge path including a series connection of a second capacitor and a first transistor operable to selectively charge and discharge said second capacitor;

wherein said second capacitor has a first terminal connected to the input terminal of the switched input circuit structure and connected to the supply voltage reference, and a second terminal connected to the ground reference through a second transistor.

7. The switched input circuit structure according to claim 6, wherein said second transistor is an N-channel MOS transistor.

8. A switched input circuit structure of the type which includes an input terminal receiving an input voltage, and an output terminal connected to an input capacitor, comprising:

an operational amplifier having a non-inverting terminal connected to a ground reference terminal, an inverting input terminal, and an output terminal feedback connected to the inverting input terminal held in a virtual ground condition; and a parallel combination of first and second charge paths which are connected between the input terminal of the switched input circuit structure and the inverting input terminal of the operational amplifier, and connected to the supply voltage reference and the ground reference, respectively; and a decoupling transistor connected between the output terminal of the operational amplifier and the supply voltage reference.

9. A switch-capacitor circuit, comprising:

a differential amplifier circuit including first and second input terminals and an output terminal;

a first circuit path including a first terminal coupled to an input of the switch-capacitor circuit, a second terminal coupled to the first input terminal of the differential amplifier, and a first capacitive element having a first terminal capable of being connected to a high reference voltage level;

a second circuit path connected in parallel relation to the first circuit path, including a second capacitive element having a first terminal coupled to the first terminal of the first capacitive element;

a first transistor coupled to a second terminal of one of the first and second capacitive elements so as to selectively place a charge on the second terminal, the first transistor being coupled to the second terminal of the second capacitive element so as to selectively charge the second terminal to the low reference voltage level.

10. The switch-capacitor circuit of claim 9, further comprising:

a second transistor is coupled to the second terminal of the first capacitive element so as to selectively charge the second terminal to the high reference voltage level.

11. A switch-capacitor circuit, comprising:

a differential amplifier circuit including first and second input terminals and an output terminal;

a first circuit path including a first terminal coupled to an input of the switch-capacitor circuit, a second terminal coupled to the first input terminal of the differential amplifier, and a first capacitive element having a first terminal capable of being connected to a high reference voltage level;

a second circuit path connected in parallel relation to the first circuit path, including a second capacitive element having a first terminal coupled to the first terminal of the first capacitive element;

a first transistor coupled to a second terminal of one of the first and second capacitive elements so as to selectively place a charge on the second terminal;

the first circuit path includes a second transistor connected in series with the first capacitive element, a third transistor connected between the first terminal of the first capacitive element and the high reference voltage level, and a fourth transistor connected between the second terminal of the first capacitive element and the high reference voltage level; and the first transistor is connected between the second terminal of the second capacitive element and the low reference voltage level.

12. A switch-capacitor circuit, comprising:

a differential amplifier circuit including first and second input terminals and an output terminal;

a first circuit path including a first terminal coupled to an input of the switch-capacitor circuit, a second terminal coupled to the first input terminal of the differential amplifier, and a first capacitive element having a first terminal capable of being connected to a high reference voltage level;

a second circuit path connected in parallel relation to the first circuit path, including a second capacitive element having a first terminal coupled to the first terminal of the first capacitive element; and a first transistor coupled to a second terminal of one of the first and second capacitive elements so as to selectively place a charge on the second terminal;

the second circuit path includes a second transistor connected in series with the second capacitive element and a third transistor connected between the second terminal of the second capacitive element and the low reference voltage level; and the first transistor is connected between the second terminal of the first capacitive element and the high reference voltage level.

13. The switched-capacitor circuit of claim 9, wherein:

the differential amplifier circuit comprises an operational amplifier;

the first input terminal of the differential amplifier circuit is an inverting input terminal; and the second input terminal of the differential amplifier circuit is a non-inverting input terminal.

14. A switch-capacitor circuit, comprising:

a differential amplifier circuit including first and second input terminals and an output terminal;

a first circuit path including a first terminal coupled to an input of the switch-capacitor circuit, a second terminal coupled to the first input terminal of the differential amplifier, and a first capacitive element having a first terminal capable of being connected to a high reference voltage level;

a second circuit path connected in parallel relation to the first circuit path, including a second capacitive element having a first terminal coupled to the first terminal of the first capacitive element;

a first transistor coupled to a second terminal of one of the first and second capacitive elements so as to selectively place a charge on the second terminal;

a feedback resistive element connected between the output terminal of the differential amplifier circuit and the first terminal of the first circuit path; and an input resistive element connected between the input terminal of the switched-capacitor circuit and the first terminal of the first circuit path.

15. A switch-capacitor circuit, comprising:

a differential amplifier circuit including first and second input terminals and an output terminal;

a first circuit path including a first terminal coupled to an input of the switch-capacitor circuit, a second terminal coupled to the first input terminal of the differential amplifier, and a first capacitive element having a first terminal capable of being connected to a high reference voltage level;

a second circuit path connected in parallel relation to the first circuit path, including a second capacitive element having a first terminal coupled to the first terminal of the first capacitive element;

a first transistor coupled to a second terminal of one of the first and second capacitive elements so as to selectively place a charge on the second terminal; and a second transistor coupled between the output terminal of the differential amplifier circuit and one of the high reference voltage level and the low reference voltage level.

16. The switched-capacitor circuit of claim 9, wherein:

during a first phase, the first and second terminals of the first capacitive element and the first terminal of the second capacitive element are selectively connected to the high reference voltage level and the second terminal of the second capacitive element is selectively connected to the low reference voltage level; and during a second phase following the first phase, the first and second terminals of the first capacitive element and the first terminal of the second capacitive element are selectively disconnected from the high reference voltage level and the second terminal of the second capacitive element is selectively disconnected from the low reference voltage level, and the second terminal of the first and second capacitive elements are selectively connected to the first input terminal of the differential amplifier circuit.

* * * * *

UNITED STATES PATENT AND TRADEMARK OFFICE
CERTIFICATE OF CORRECTION

PATENT NO.    : 6,380,789 B1
DATED         : April 30, 2002
INVENTOR(S)   : Baschirotto et al.

It is certified that error appears in the above-identified patent and that said Letters Patent is hereby corrected as shown below:

Column 3,
Line 22, replace "to the is input terminal" with -- to the input terminal --
Line 29, replace "MOS 20 transistor" with -- MOS transistor --
Line 66, replace "charge the capacitor C1" with -- charges the capacitor C1 --

Column 4,
Line 4, replace "turned on stated" with -- turned on state --

Signed and Sealed this

Sixth Day of May, 2003

JAMES E. ROGAN
*Director of the United States Patent and Trademark Office*